(12) United States Patent
Cleeves

(10) Patent No.: US 7,768,038 B2
(45) Date of Patent: Aug. 3, 2010

(54) POST VERTICAL INTERCONNECTS FORMED WITH SILICIDE ETCH STOP AND METHOD OF MAKING

(75) Inventor: James M. Cleeves, Redwood City, CA (US)

(73) Assignee: SanDisk 3D LLC, Milpitas, CA (US)

( * ) Notice: Subject to any disclaimer, the term of this patent is extended or adjusted under 35 U.S.C. 154(b) by 71 days.

(21) Appl. No.: 11/849,174

(22) Filed: Aug. 31, 2007

(65) Prior Publication Data

US 2008/0029901 A1 Feb. 7, 2008

Related U.S. Application Data

(62) Division of application No. 10/611,246, filed on Jun. 30, 2003, now Pat. No. 7,307,012.

(51) Int. Cl.
*H01L 23/48* (2006.01)
(52) U.S. Cl. .............. 257/211; 257/774; 257/E21.575; 257/E23.011; 438/618
(58) Field of Classification Search ................ 257/499, 257/774, 776, 529, 209, 211, 296, 530, E21.575, 257/E23.145, E23.147, E23.149, E23.157, 257/E21.589; 438/630, 618
See application file for complete search history.

(56) References Cited

U.S. PATENT DOCUMENTS

| 5,162,259 | A | 11/1992 | Kolar et al. |
|---|---|---|---|
| 5,190,893 | A | 3/1993 | Jones et al. |
| 5,419,805 | A | 5/1995 | Jolly |
| 5,510,292 | A | 4/1996 | Hayashi |
| 5,614,756 | A * | 3/1997 | Forouhi et al. ............... 257/530 |
| 5,652,182 | A | 7/1997 | Cleeves |
| 5,835,396 | A * | 11/1998 | Zhang .......................... 365/51 |
| 6,004,874 | A | 12/1999 | Cleeves |
| 6,025,273 | A | 2/2000 | Chen et al. |

(Continued)

OTHER PUBLICATIONS

Non-Final Office Action dated Sep. 14, 2005, in connection with U.S. Appl. No. 10/611,246.
Final Office Action dated Jun. 1, 2007, in connection with U.S. Appl. No. 10/611,246.
Notice of Allowance dated Sep. 25, 2007, in connection with U.S. Appl. No. 10/611,246.

(Continued)

*Primary Examiner*—Victor A Mandala
*Assistant Examiner*—Scott Stowe
(74) *Attorney, Agent, or Firm*—Cooper Legal Group LLC

(57) ABSTRACT

A method to form a vertical interconnect advantageous for high-density semiconductor devices. A conductive etch stop layer, preferably of cobalt silicide, is formed. The etch stop layer may be in the form of patterned lines or wires. A layer of contact material is formed on and in contact with the etch stop layer. The layer of contact material is patterned to form posts. Dielectric is deposited over and between the posts, then the dielectric planarized to expose the tops of the posts. The posts can serve as vertical interconnects which electrically connect a next conductive layer formed on and in contact with the vertical interconnects with the underlying etch stop layer. The patterned dimension of vertical interconnects formed according to the present disclosure can be substantially the same as the minimum feature size, even at very small minimum feature size.

25 Claims, 11 Drawing Sheets

U.S. PATENT DOCUMENTS

| | | | |
|---|---|---|---|
| 6,034,882 | A | 3/2000 | Johnson et al. |
| 6,074,914 | A * | 6/2000 | Ogura ........................ 438/257 |
| 6,255,701 | B1 | 7/2001 | Shimada |
| 6,303,503 | B1 | 10/2001 | Kamal et al. |
| 6,635,406 | B1 | 10/2003 | De Leeuw et al. |
| 6,780,762 | B2 | 8/2004 | Ireland |
| 6,833,623 | B2 | 12/2004 | Leiphart |
| 7,229,921 | B2 * | 6/2007 | Hironaga et al. ............ 438/687 |
| 2001/0000242 | A1 * | 4/2001 | Huang ........................ 438/106 |
| 2001/0035545 | A1 * | 11/2001 | Schuster-Woldan et al. . 257/296 |
| 2002/0079553 | A1 | 6/2002 | Cleeves |
| 2002/0196654 | A1 * | 12/2002 | Mitarai et al. ............... 365/145 |

OTHER PUBLICATIONS

Final Office Action dated Mar. 1, 2006, in connection with U.S. Appl. No. 10/611,246.

Non-Final Office Action dated Jul. 24, 2006, in connection with U.S. Appl. No. 10/611,246.

Final Office Action dated Jan. 8, 2007, in connection with U.S. Appl. No. 10/611,246.

* cited by examiner

12

10

8

*Prior Art*

*Prior Art*

Fig. 1b

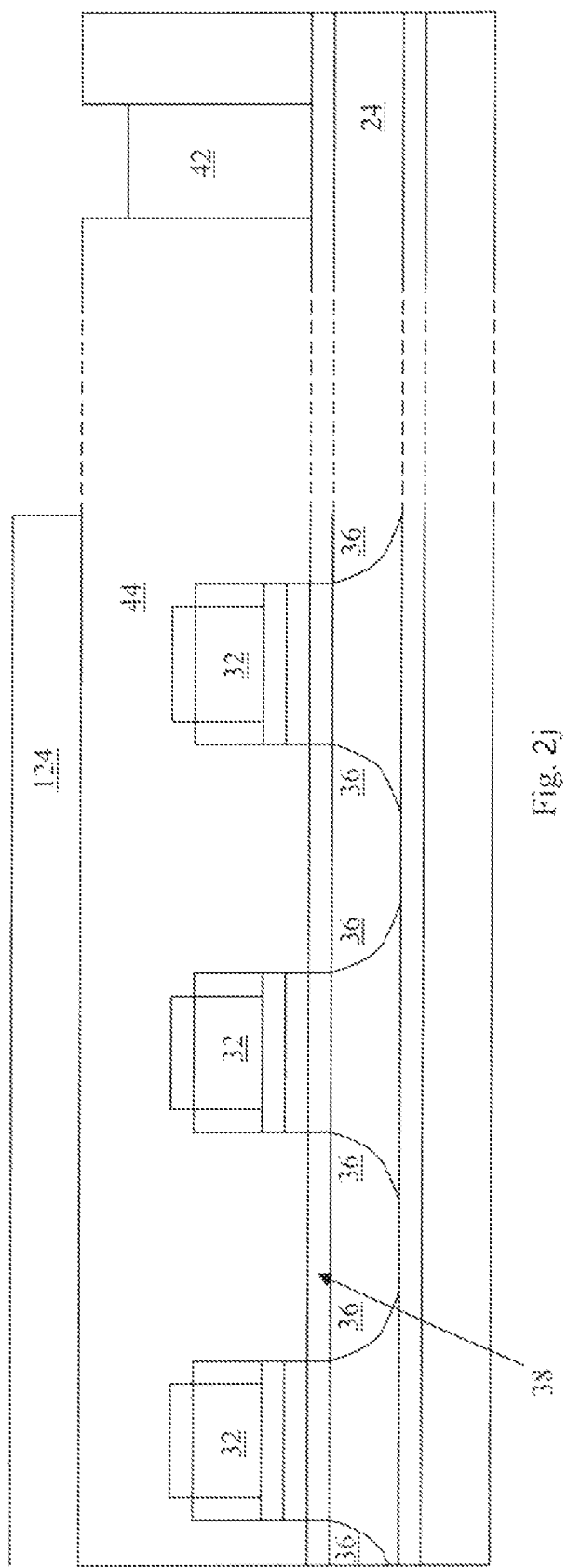

POST VERTICAL INTERCONNECTS FORMED WITH SILICIDE ETCH STOP AND METHOD OF MAKING

This application is a divisional of Ser. No. 10/611,246 filed Jun. 30, 2003, now U.S. Pat. No. 7,307,012 which is entitled "Post Vertical Interconnects Formed With Silicide Etch Stop and Method of Making".

BACKGROUND

The disclosure relates to a method for forming vertical interconnects in high-density semiconductor devices. In general, as device densities increase, formation of vertical interconnects, or vias, becomes more difficult.

Conventional vertical interconnect formation involves etching a high-aspect ratio void in a dielectric material, then filling the void with a conductive material. As dimensions decrease, the etch required to create the void becomes more difficult to perform cleanly and completely. Stopping the etch at the right point can also present challenges. Often it becomes necessary for vertical interconnects to be formed that are larger than the minimum feature size.

The present inventor, in U.S. Pat. No. 6,004,874, "Method for Forming an Interconnect," describes forming a blanket etch stop layer, patterning post vertical interconnects using materials that provide an imperfect etch stop, then patterning the etch stop layer into lines or wires in the context of traditional two-dimensional structures.

There is a need, therefore, for a method of vertical interconnect formation with an easily controllable etch that allows vertical interconnects to be created at approximately the minimum feature size. This technique proves particularly valuable in dense monolithic three dimensional memory arrays.

SUMMARY

The present invention is defined by the following claims, and nothing in this section should be taken as a limitation on those claims. In general, the invention is directed to a method to for forming vertical interconnects using a silicide etch stop suitable for high-density devices and arrays.

A first aspect of the invention provides for a method for forming a vertical interconnect, the method comprising forming an etch stop layer comprising cobalt silicide or nickel silicide; forming a layer of contact material in contact with the etch stop layer; and patterning and etching the contact material to form the vertical interconnect, wherein the etching stops on the etch stop layer.

Another aspect of the invention provides for a plurality of active elements comprises active elements having a minimum feature size less than about 0.25 micron; and at least one vertical interconnect having a smallest patterned dimension substantially the same as the minimum feature size.

A related embodiment provides for a plurality of active elements comprising active elements having a minimum feature size; and at least one vertical interconnect, the interconnect having a smallest patterned dimension, formed by a method comprising forming an etch stop layer comprising cobalt silicide or nickel silicide; forming a layer of contact material in contact with the etch stop layer; and patterning and etching the contact material to form the vertical interconnect, wherein the etching of the patterning and etching step stops on the etch stop layer; and wherein the smallest patterned dimension of the vertical interconnect is substantially the same as the minimum feature size.

Another aspect of the invention provides for a monolithic three dimensional memory array comprising first and second memory levels, and further comprising first vertical interconnects, the first interconnects formed by a method comprising forming a first etch stop layer, forming a first contact layer; and patterning and etching the first contact layer to form the first vertical interconnects, wherein the first etch stop layer acts as an etch stop.

An embodiment provides for a method for forming transistors and vertical interconnects, the method comprising forming a series string of transistors, the transistors sharing a transistor body; forming an etch stop layer in contact with the transistor body; forming a layer of contact material in contact with the etch stop layer; and patterning and etching the contact material to form the vertical interconnects, wherein the etch stop material acts as an etch stop.

An aspect of the invention provides for a method for forming vertical interconnect comprising forming an etch stop wire; after the step of forming the etch stop wire, forming contact material in contact with the etch stop wire; and patterning and etching the contact material to form vertical interconnects comprising the contact material, wherein the etch stops on the etch stop wire.

A preferred embodiment of the invention provides for a method for forming a vertical interconnect forming a layer of contact material; and patterning and etching a vertical interconnect comprising the contact material wherein the vertical interconnect is electrically coupled to a memory level, to top metal, or to CMOS formed in a substrate in a monolithic three dimensional memory array.

Another embodiment provides for a memory array comprising a plurality of first array lines extending in a first direction; a plurality of second array lines extending in a second direction substantially perpendicular to the first direction; and a plurality of vertical interconnects formed in a fan-out area, wherein each vertical interconnect comprises contact material and is formed on or in contact with an etch stop layer.

A related embodiment provides for a memory array comprising a plurality of first array lines extending in a first direction; a plurality of second array lines extending in a second direction substantially perpendicular to the first direction; and a plurality of vertical interconnects formed in a fan-out area, wherein each vertical interconnect is patterned and etched as a positive feature, the etch stopping on an etch stop layer.

Yet another aspect of the invention provides for a method for forming an interconnect comprising forming an etch stop layer comprising cobalt silicide or nickel silicide; forming a layer of contact material in contact with the etch stop layer; and patterning and etching the contact material to form the interconnect, wherein the etching stops on the etch stop layer, and where the interconnect connects conductive materials that are not vertically separate.

Each of the aspects and embodiments of the invention can be used alone or in combination with one another.

Preferred embodiments will now be described with reference to the attached drawings.

BRIEF DESCRIPTION OF THE DRAWINGS

FIGS. 1a-1e are cross-sectional views of prior art formation of a vertical interconnect between metallization and circuits in a substrate by filling a contact void.

FIGS. 2a-2l are cross-sectional views of formation of a vertical interconnect.

DETAILED DESCRIPTION

Figures 1A, 1B:
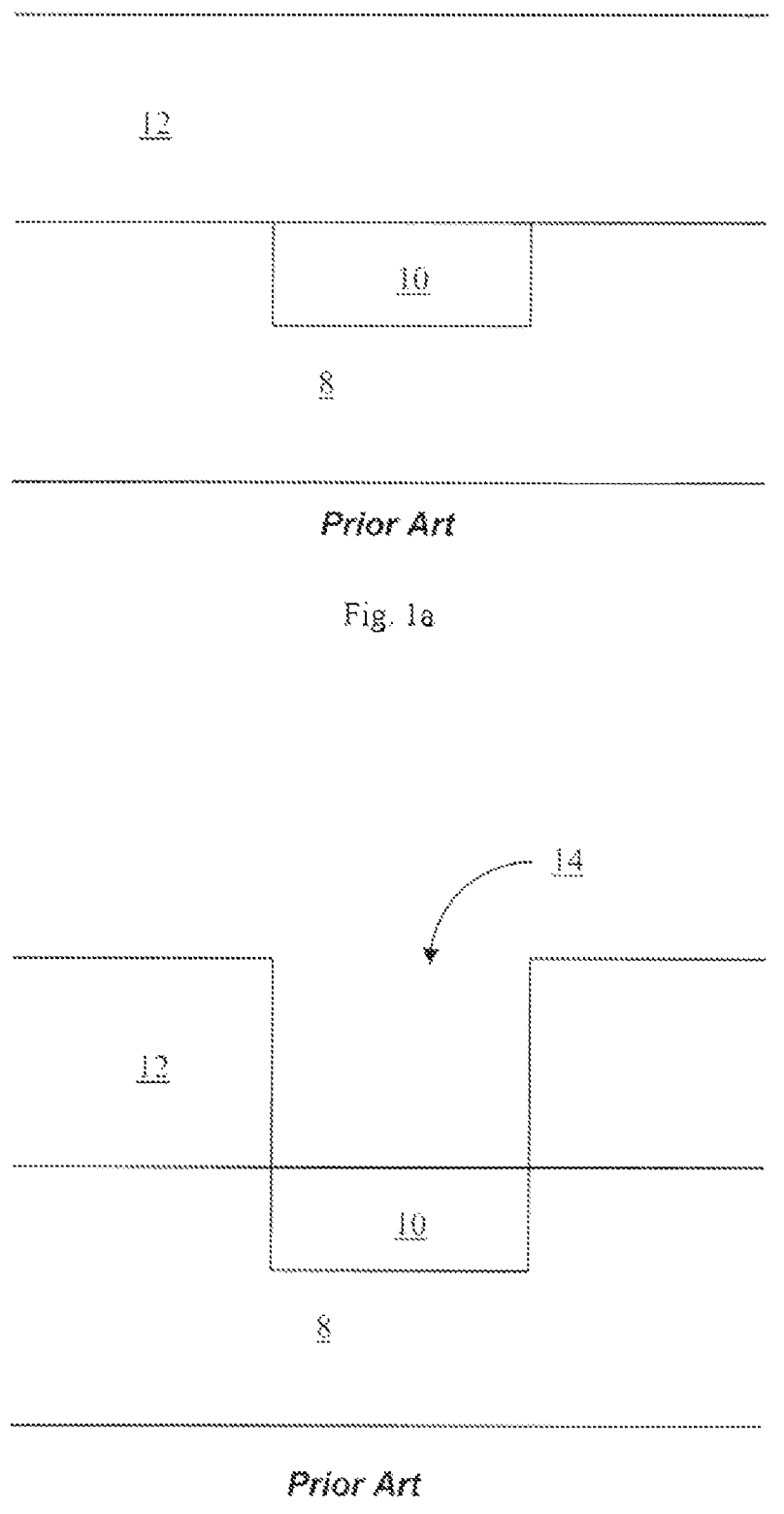
Figure 1C:
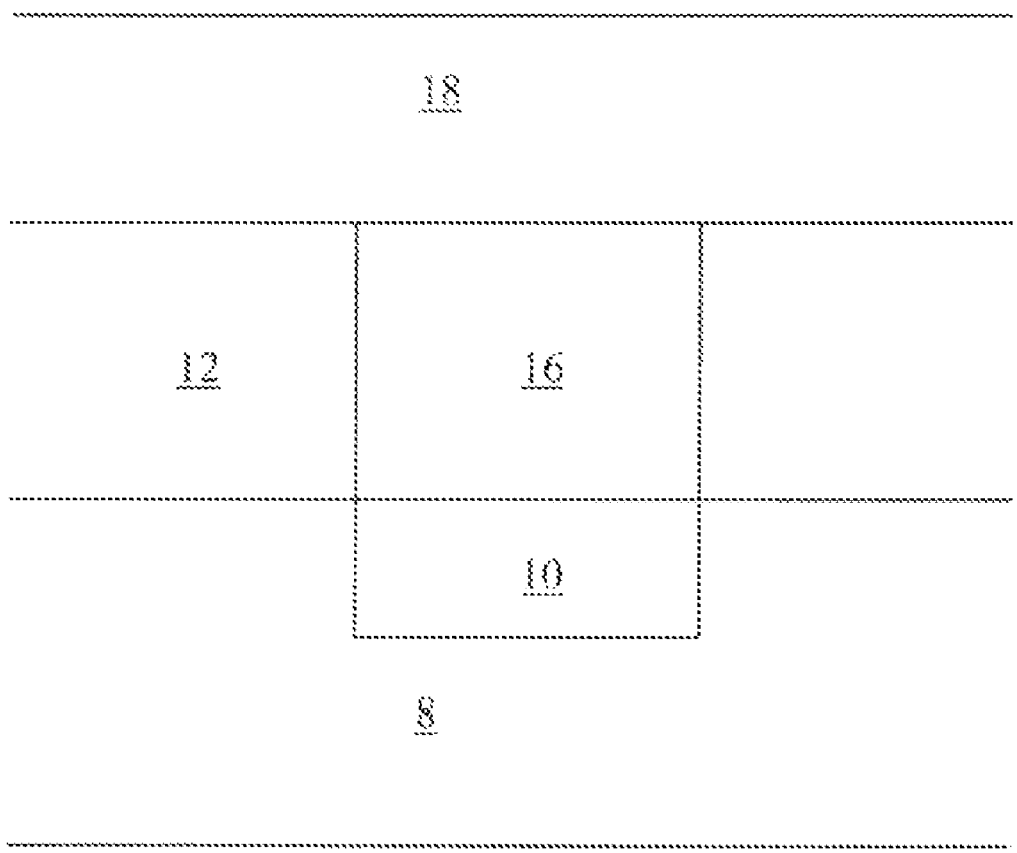

Vertical interconnects, also known as vias, serve to electrically connect semiconductor devices, metallization, and active and passive elements that are vertically separate. A common strategy to connect metal wiring formed over and isolated by a dielectric from circuitry in a substrate, for example, as shown in FIGS. 1a through 1c. In FIG. 1a, contact 10 formed in the substrate 8 is covered by dielectric 12. Metal wiring is to be formed over dielectric 12.

To provide an electrical connection between contact 10 and the metal wiring that will overlie dielectric 12, a contact void 14 is formed, as shown in FIG. 1b. A conventional technique to form contact void 14 is to deposit photoresist on dielectric 12, then use a photoresist mask to selectively remove photoresist and expose the area where contact void 14 is to be formed. A wet or dry etch then etches dielectric 12 in the exposed area, forming contact void 14, and the photoresist is removed.

The void is then filled with a conductive material. Tungsten is used frequently for this purpose, though many other conductive materials are conventionally used as well. Planarization is performed, for example by chemical mechanical polishing (CMP) or etchback, to remove any excess conductive material, providing a completed vertical interconnect 16, shown in FIG. 1c.

Next metal wiring 18 is formed over dielectric 12 and contact with vertical interconnect 16. It will be seen that vertical interconnect 16 provides an electrical connection between contact 10 and metal wiring 18.

As densities of semiconductors increase, the photolithography and etch required to create a contact void becomes more difficult. During patterning, it can be difficult to expose a small area of photoresist completely enough to form a high aspect ratio void. Similarly, a high aspect ration void presents a challenging etch. Stopping the tech when desired may call for complex etch chemistries. It has generally been necessary to form contact voids with patterned dimensions larger than the minimum feature size otherwise achievable in semiconductor devices, typically ten to thirty percent larger. This decreases the density of semiconductor devices.

The "minimum feature size" is the width of the smallest line or gap in patterned semiconductor devices on a die.

The "patterned dimension" of a vertical interconnect is its smallest dimension which is achieved by patterning. If the vertical interconnect has a rectangular cross section, for example, the patterned dimension of the vertical interconnect is the shortest side of the rectangle. If the vertical interconnect has a substantially circular cross section (as may be caused due to rounding that takes place when very small features are etched) the patterned dimension is the diameter of that substantially circular cross section.

Preferred embodiments of the present invention provide for a method for forming vertical interconnects which are etched, the etch stopping on an etch stop layer. In preferred embodiments, vertical interconnects formed according to the methods of the present invention have a patterned dimension substantially the same as the minimum feature size of the die on which they are formed.

In general terms, in embodiments of the present invention, a conductive etch stop layer is formed. The etch stop layer may be formed into conductive lines, or wires. A contact material is deposited on and in contact with the etch stop layer. The contact material is patterned and etched to form a vertical interconnect, the etch stopping on the etch stop layer. Patterning and etching vertical interconnects as positive features, rather than as high-aspect ratio voids which are then filled, allows for the vertical interconnects to be formed at less than or substantially the same minimum feature size as the lines, gates, or other features they serve to connect.

A detailed description of a preferred embodiment of the present invention will be provided. It will be apparent to the skilled practitioner that the detailed information here is provided as an example only, and that many steps and materials can be varied, added, or omitted while still falling within the scope of the invention.

In this example, vertical interconnects are formed in a monolithic three dimensional memory array in which the cells are SONOS memory cells. SONOS memory cells are charge storage devices. A SONOS cell includes a channel, typically of silicon. On top of the channel, from the bottom up, are a tunneling oxide, a charge trapping layer typically of nitride, and a blocking oxide. On top of the blocking oxide is a gate, typically of silicon. The silicon-oxide-nitride-silicon stack gives the device its name, SONOS, though other materials can be used. The SONOS device acts as a memory cell by trapping charge in the nitride layer. The cell is programmed when charge is trapped, and is unprogrammed when no charge is trapped, or vice versa.

The techniques described here, though, could be used to form vertical interconnects in memory arrays with memory cells of different types, in conventional two dimensional memory arrays in which the memory is fabricated in the substrate rather than above it, or to form vertical interconnects which provide connection to logic or other devices.

A related monolithic three dimensional memory array is taught in Walker et al., U.S. application Ser. No. 10/335,089, "Method for Fabricating Programmable Memory Array Structures for Incorporating Series-Connected Transistor Strings," filed Dec. 31, 2002. This application is assigned to the assigned to the assignee of the present application and hereby incorporated by reference. Some of the methods and details described here by way of illustrations are described more fully in Walker et al. For simplicity, not all of the details in Walker et al. are reproduced in this description, but none of the methods of Walker et al. is intended to be excluded.

Figure 2A:
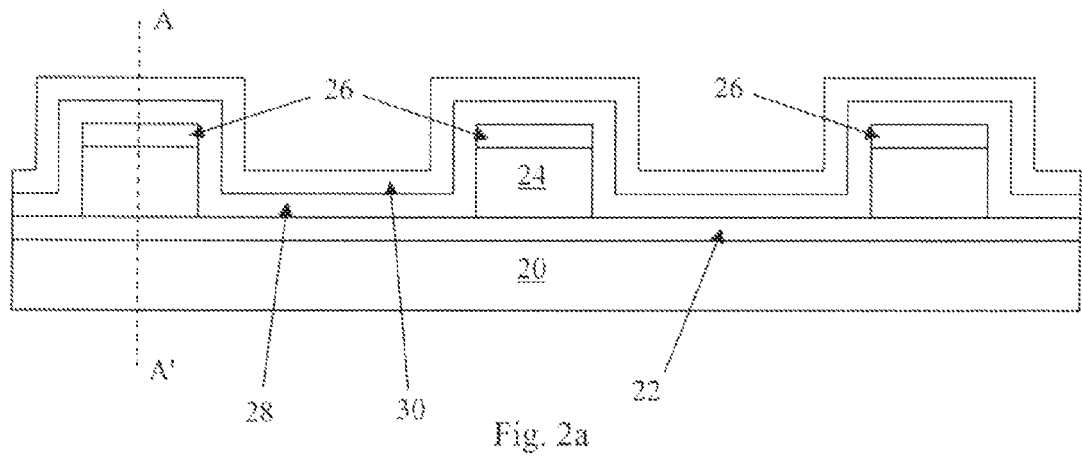

Turning to FIG. 2a, in this example, a semiconductor wafer substrate 20 is covered with a dielectric layer 22. CMOS circuitry may be formed in the substrate 20. A layer 24 of polycrystalline silicon, here referred to as polysilicon, is formed over the dielectric layer 22. Polysilicon layer 24 can be formed by any method known in the art, and is preferably about 1000 angstroms thick.

Polysilicon layer 24 is patterned and etched to form substantially parallel lines of silicon. Ultimately each line will serve as the transistor body of a series string of transistors, in this example SONOS transistors, and these lines will be referred to as body polysilicon lines 24 for clarity. The width of polysilicon lines 24 may be the minimum feature size. In FIG. 2a, polysilicon lines 24 are shown in cross-section.

Figure 2B:
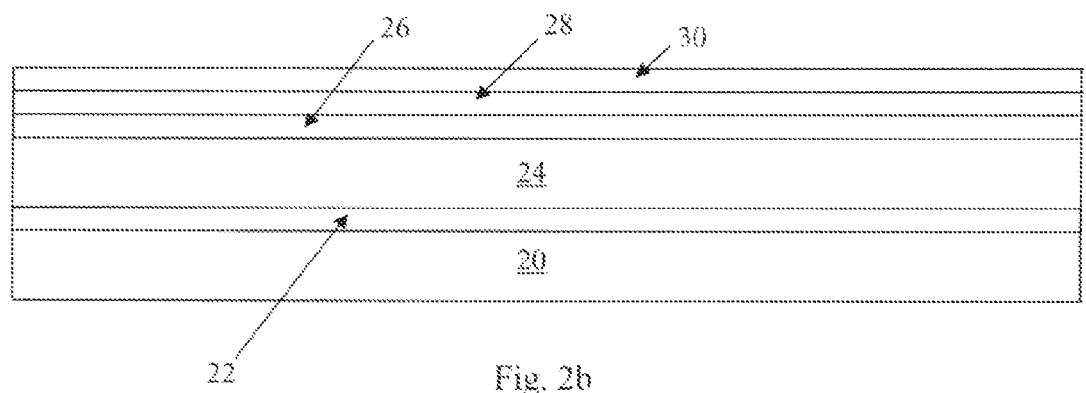

An oxide layer 26 is formed over body polysilicon lines 24. Preferably oxide layer 26 is thermally grown silicon dioxide. Thermally grown silicon dioxide grows on silicon, and will be present only over body polysilicon lines 24, not between them. Alternately, oxide layer 26 may be deposited; in this case it will exist between the lines as well. Nitride layer 28 and oxide layer 30 are formed to complete an ONO (oxide-nitride-oxide) stack over body polysilicon lines 24. These layers can be formed by any method known in the art. (Note nitride layer 28 and oxide layer 30 will probably not be as conformal as shown in FIG. 2a. FIG. 2a, along with the other figures, is meant as an illustration, not an exact representative.) FIG. 2b shows the same layers viewed at a right angle to the view in FIG. 2b. The view in FIG. 2b is along line A-A' in FIG. 2a.

Figure 2C:
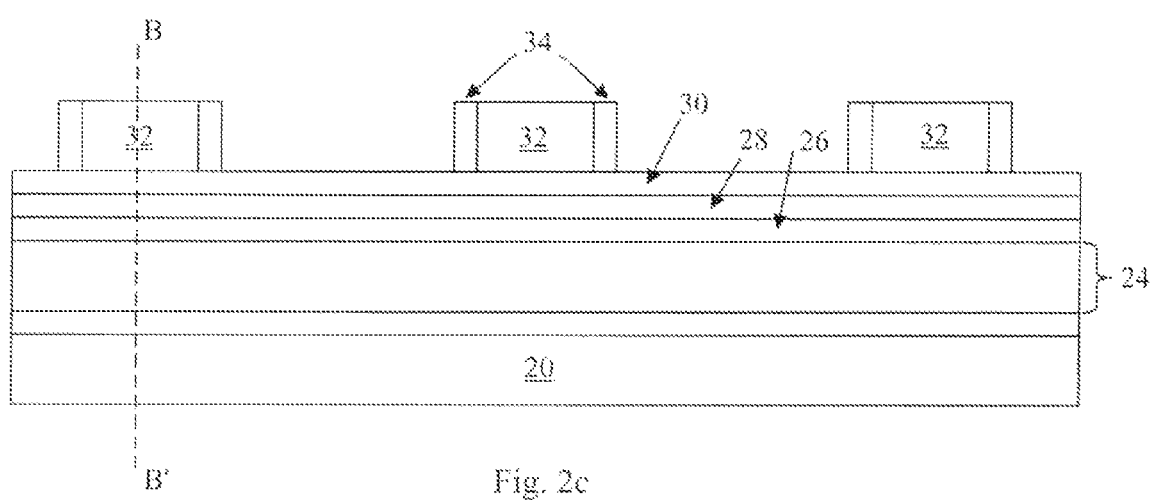
Figure 2D:
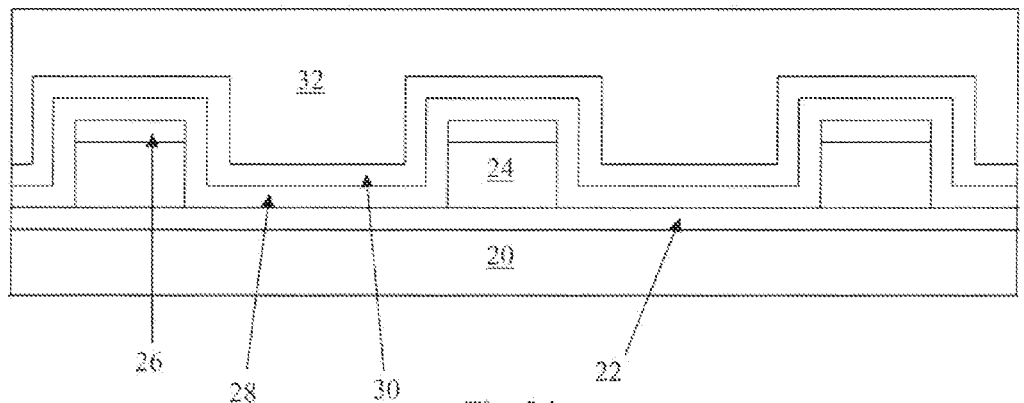

Turning to FIG. 2c (which is viewed from the same direction as FIG. 2b), gate polysilicon 32 is formed over oxide layer 30. Gate polysilicon 32 is, for example, in situ doped polysilicon. Gate polysilicon 32 is patterned and etched into substantially parallel lines which are preferably substantially perpendicular to body polysilicon lines 24, and are shown in cross-section in FIG. 2c. Oxide spacers 34 are formed adjacent to gate polysilicon lines 32 by depositing a conformal oxide, then performing an isotropic etch which removes oxide from horizontal surfaces only. FIG. 2d shows the same layers viewed at a right angle to the view in FIG. 2c. The view in FIG. 2d is along line B-B' in FIG. 2c.

Figure 2E:
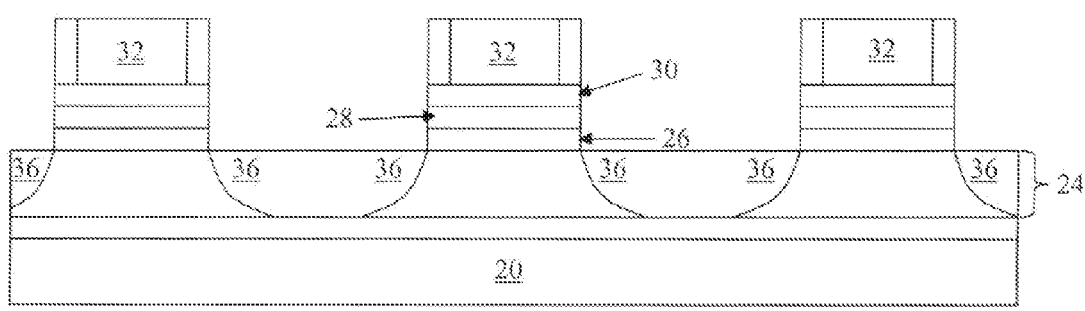

Turning to FIG. 2e, (and returning to the same viewing angle as FIG. 2c) source and drain regions 36 can be implanted through the oxide 26, nitride 28 and oxide 30, then oxide 26, nitride 28 and oxide 30 removed in areas between gate polysilicon lines 32. Alternatively, oxide 26, nitride 28 and oxide 30 can be removed between gate polysilicon lines 32 first, then source and drain regions 36 can be implanted. In either case, body polysilicon lines 24, in which and drain regions 36 are formed, are exposed between gate polysilicon lines 32.

Figure 2F:
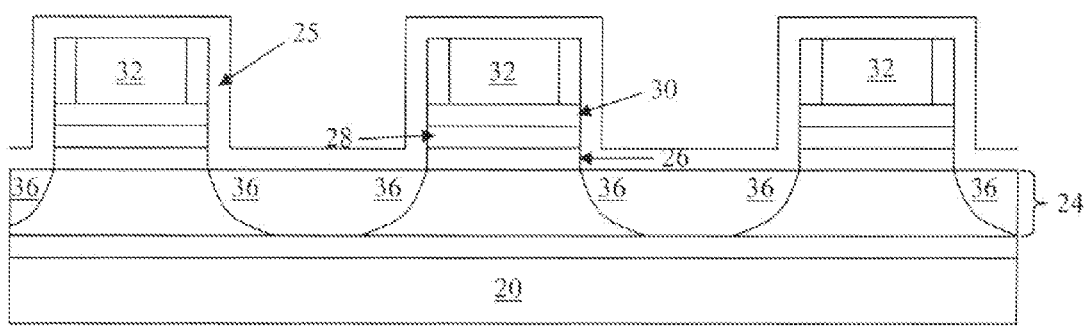
Figure 2G:
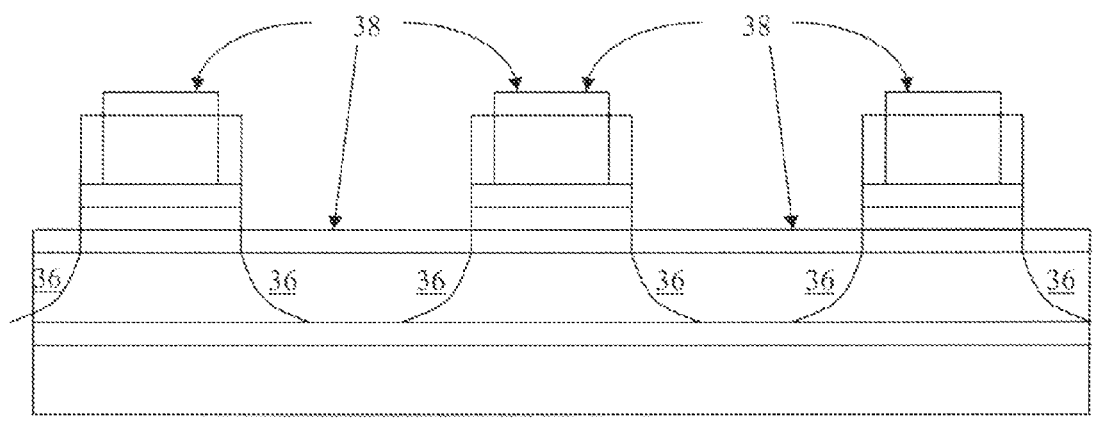

Next an etch stop layer is formed. As shown in FIG. 2f, a layer of a metal 25, for example cobalt, is deposited in contact with gate polysilicon lines 32 and in contact with body polysilicon lines 24 between gate polysilicon lines 32. A layer of titanium, preferably about 50 to 100 angstroms thick, may optionally be deposited on top of cobalt or nickel layer 25 to prevent oxidation (not shown.) Layer 25 is annealed at a suitable temperature to react portions of the cobalt with underlying silicon to form etch stop layer 38 of cobalt silicide, shown in FIG. 2g. For example, the anneal may be carried out in a rapid thermal annealing system at about 400 to about 700 degrees C. for about 20 to about 100 seconds, preferably at about 440 degrees C. for about 60 seconds. Cobalt silicide is formed only where cobalt contacts silicon, as on top of polysilicon gates 32 and on polysilicon lines 24. Where cobalt layer 25 contacts oxide or nitride, unreacted cobalt remains after the anneal. The unreacted cobalt is then removed between the cobalt silicide lines using a wet etch, leaving cobalt silicide etch stop lines 38. If a titanium layer was deposited to prevent oxidation of cobalt or nickel, it will be removed as well.

In other preferred embodiments, nickel or titanium can be deposited instead of cobalt, lines of nickel silicide or titanium silicide formed instead of cobalt silicide over the polysilicon lines, and unreacted nickel or titanium removed between the lines of nickel silicide or titanium silicide.

In an alternate embodiment (not shown), gate polysilicon 32 can be deposited, then, before patterning, a layer of titanium deposited on top of and in contact with it. A subsequent anneal converts the titanium to an etch stop layer 38 of titanium silicide, then etch stop layer 38 and gate polysilicon 32 can be patterned and etched into gate polysilicon lines 32 topped with etch stop lines 38. In this embodiment, the etch stop layer is formed only on top of the gate polysilicon lines 32, not on top of body polysilicon lines 24.

It is preferred that not all of the body polysilicon lines 24 be consumed by cobalt silicide, nickel silicide, or titanium silicide formation. If body polysilicon lines 24 were 1000 angstroms thick before silicide formation, the remaining silicon is preferably about 500 angstroms after silicide formation.

Figure 2H:
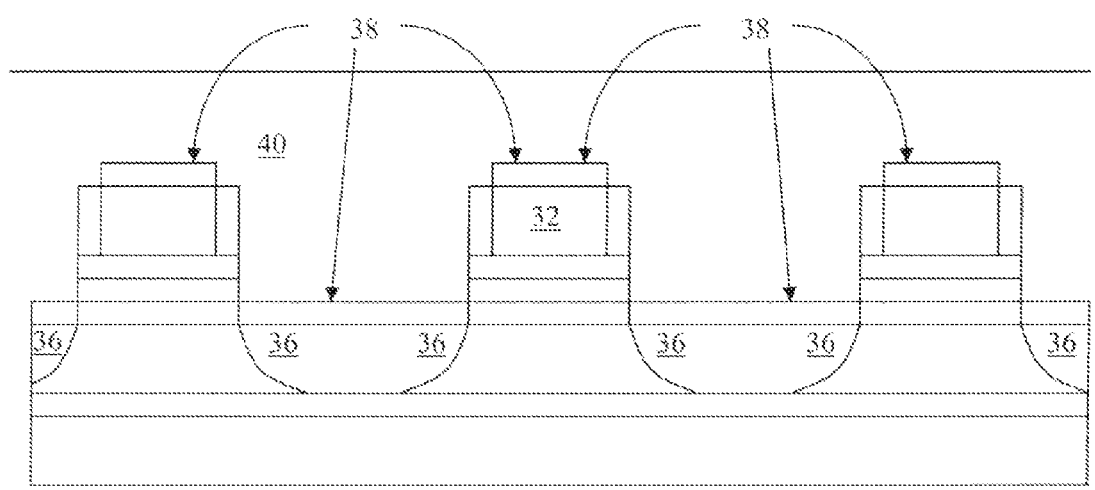

Next, in FIG. 2h, contact material 40 is deposited in contact with etch stop layer 38. Contact material 40 can be polysilicon, tungsten, aluminum, an aluminum alloy, or any other conductive material that has good etch selectivity with cobalt silicide, nickel silicide, or titanium silicide.

Figure 2I:
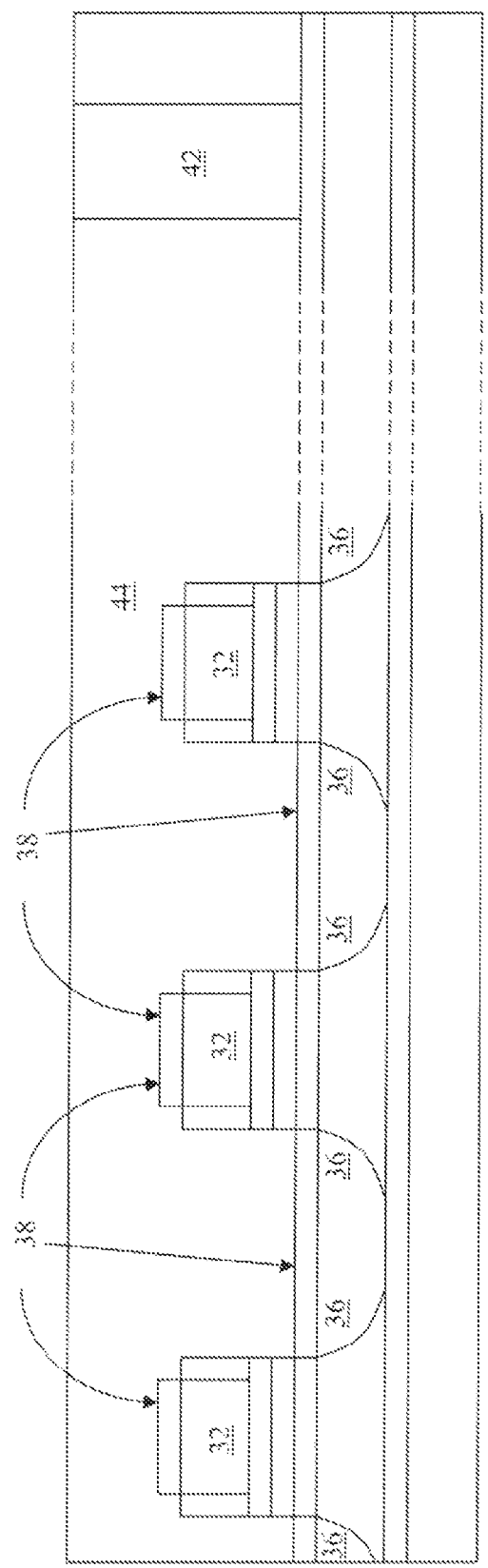

Contact material 40 is then patterned and etched to form vertical interconnect 42 comprising the contact material formed earlier, shown in FIG. 2i. Only one vertical interconnect 42 is shown in FIG. 2i, but multiple vertical interconnects can be formed during this etch. After etch, each vertical interconnect 42 is a free-standing post. Etch selectivity is very good—probably about 50:1—between contact material silicon, tungsten, or aluminum and etch stop layer cobalt silicide or nickel silicide. Etch selectivity between the contact material and the etch stop materials named will vary with different etch chemistries and different ion bombardment and chemical properties of the plasma, and may be less than 50:1, possibly better than 20:1, and is at least 5:1. Titanium silicide is etched by chlorine etchants, so it serves as a less effective and less preferred etch stop.

Typically chlorine etchants are used to etch silicon and aluminum; while fluorine etchants are used to etch tungsten. Although other etch chemistries may be used, silicon vertical interconnects formed on and etch stop layer of cobalt silicide or nickel silicide can be etched using following etchants: $Cl_2$, HBr, He and $O_2$. Tungsten vertical interconnects formed on an etch stop layer of cobalt silicide or nickel silicide can be etched using fluorine plasma with passivating and ion bombardment additives to control sidewall slope and undercut. Advantageous choices for a fluorine source are $SF_6$ and $NF_3$, while $N_2$, and Ar are useful additives.

With contact material and etch stop layer material chosen for good etch selectivity, the etch stop layer 38 acts as an effective etch stop, and stops the etch that forms vertical interconnect 42. In FIG. 2i, vertical interconnect 42 is shown formed on an extension of body polysilicon line 24, which may be outside of the array area. Vertical interconnects 42 can be formed wherever they are needed. Vertical interconnects may also be formed on top of and in contact with the etch stop layer 38 on top of gate polysilicon lines 32, for example.

The space between vertical interconnects 42 and gate polysilicon lines 32, with spacers 34, is filled with dielectric 44, then planarized to expose the tops of vertical interconnects 42. Vertical interconnects 42 are now in place to make an electrical connection between any conductive structure formed above dielectric 44 and the etch stop layer 38 below. Specifically, vertical interconnects 42 are electrically coupled to etch stop layer 38, which is in contact with body polysilicon lines 24. Each body polysilicon line 24 is a transistor body, and the transistors, each with gate 32 and source and drain 36, are a series string of transistors which share the transistor body.

If a monolithic three dimensional memory array is being formed, the first memory level, comprising first vertical interconnect 42, has just been completed. A second memory level can be formed over the first memory level by repeating the steps listed above. Turning to FIG. 2j, a layer of polysilicon is deposited on dielectric 44, then a silicon etch is performed to create second body silicon lines 124, analogous and parallel to first body silicon lines 24. The silicon etch that forms first body silicon lines 124 will stop at dielectric 44. Body silicon lines 124 may be patterned and etched to expose vertical interconnect 42; where vertical interconnect 42 is exposed during the silicon each it will become recessed, as shown.

Figure 2K:
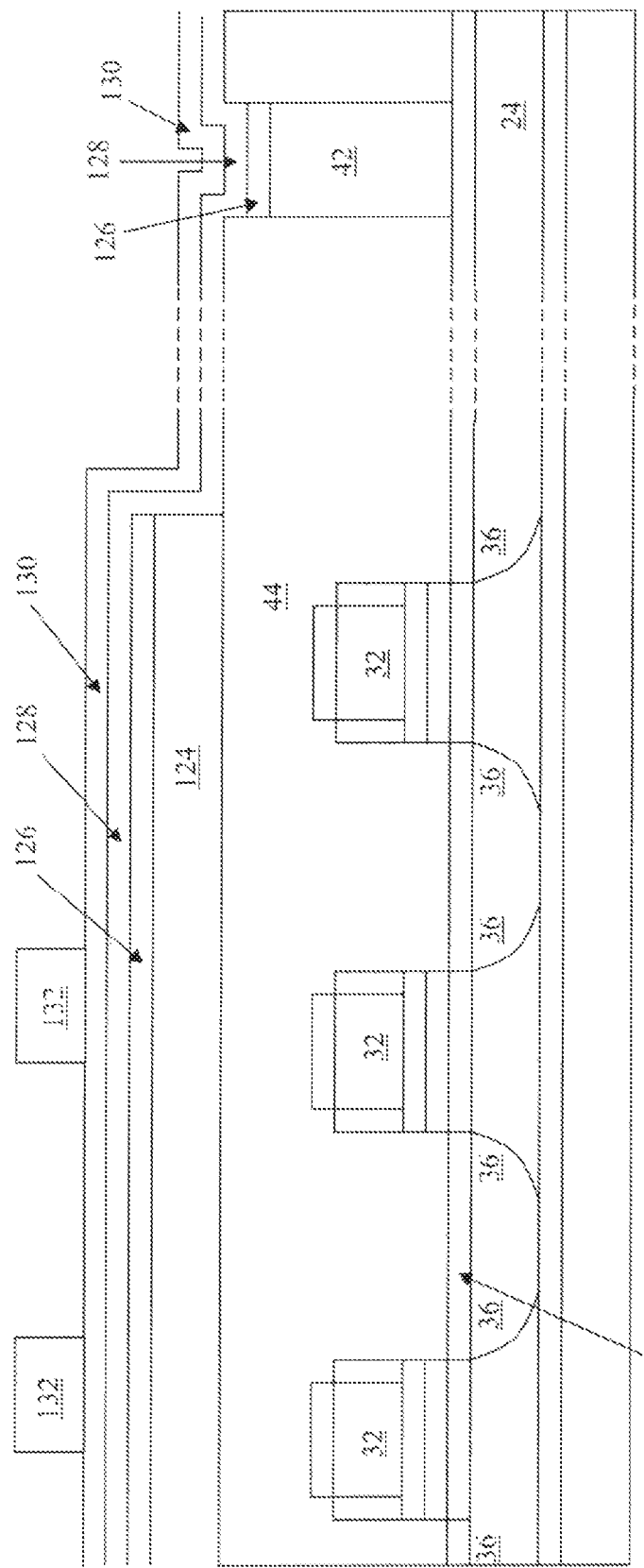
Figure 21:
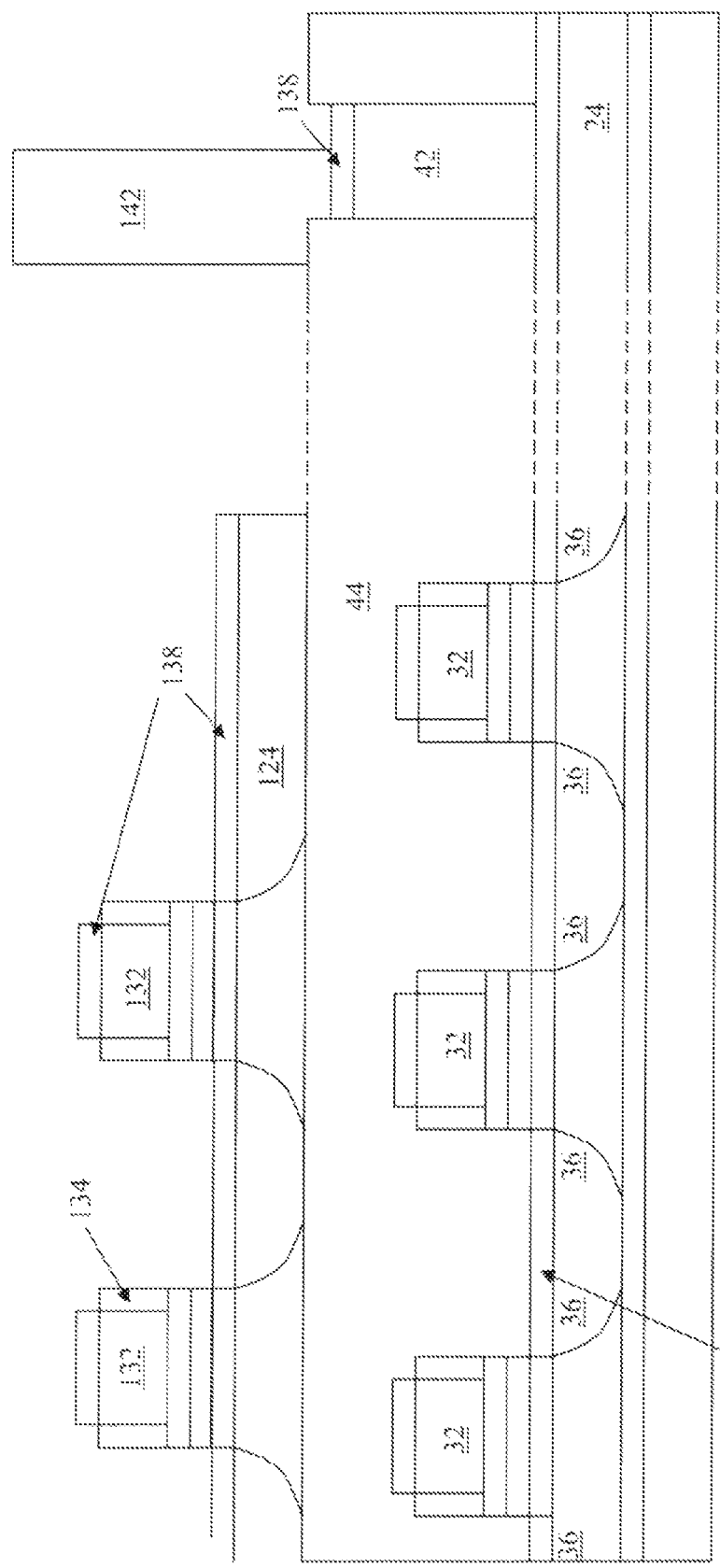

As before, oxide layer 126 is grown on silicon body lines 124 and nitride layer 128 and oxide layer 130 are deposited, as shown in FIG. 2k. Gate polysilicon 132 is deposited and etched into lines substantially perpendicular to silicon body lines 124. Vertical interconnect 42 is covered by oxide 126, nitride 128, and oxide 130 during the etch of gate polysilicon 132 and thus protected during that etch and not recessed further.

Turning to FIG. 2l, continuing as before, the ONO layers (oxide 126, nitride 128 and oxide 130) are removed between gate polysilicon lines 132 to expose body silicon lines 124, and removed from the top of vertical interconnect 142 at the same time. Spacers 134 and second etch stop layer 138 is then formed as before. It will be recalled that this etch sop layer is formed by depositing a metal, for example cobalt, and annealing to create cobalt silicide wherever the cobalt contacts silicon; thus cobalt silicide etch stop layer 138 will be formed atop first vertical interconnect 42. Second vertical interconnect 142 can be formed as before, by depositing contact material on etch stop layer 138 and patterning and etching to form second vertical interconnect 142. Dielectric fill and planarization complete a second memory level, which comprises second vertical interconnects 142. It will be seen that at least one of the second vertical interconnects 142 can be electrically coupled to at least one of the first vertical interconnects 42. Some misalignment of interconnect 142 and interconnect 42, as shown, can be tolerated.

Additional memory levels can be formed over the second memory level, and additional vertical interconnects formed. Vertical interconnects can provide an electrical path between two memory levels, between a memory level and top metal overlying the array, between a memory level and CMOS circuitry formed in the underlying substrate, or elsewhere in the array where an electrical connection between vertically separate elements is required. Preferably four to eight memory levels are formed above a monocrystalline substrate or silicon on insulator.

In this example, etch stop layer 38 was formed on polysilicon. It will be apparent that etch stop layer 38 could be formed on monocrystalline silicon instead.

Figure 3A:
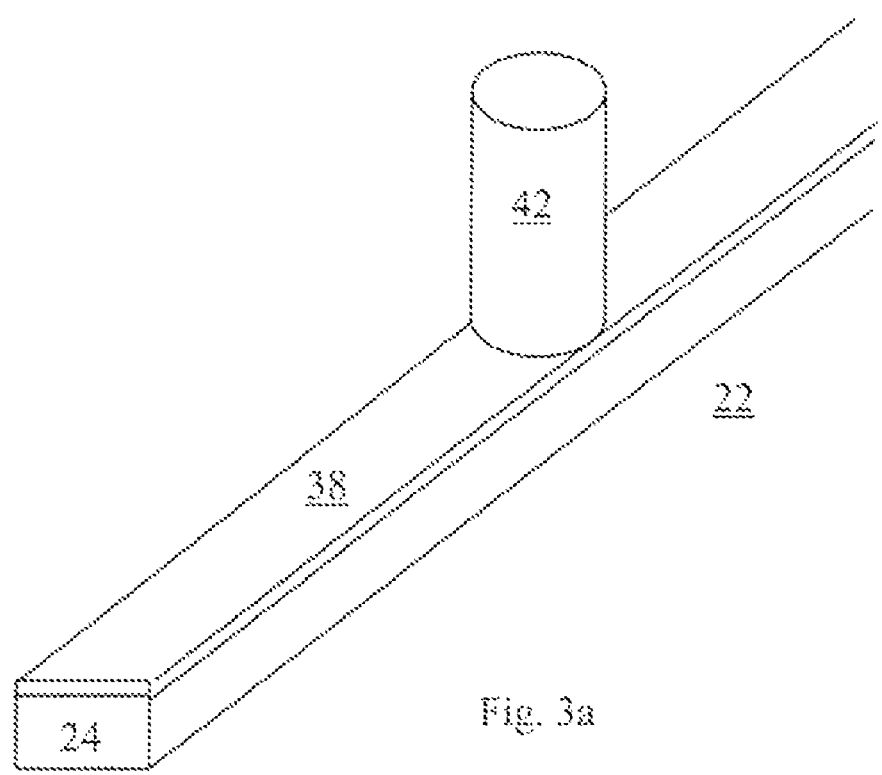
FIG. 3a and FIG. 3b are perspective views showing misalignment tolerance of vertical interconnects.

Vertical interconnects are placed to form an electrical connection to conductive or semiconductive structures above and below the interconnects, usually to patterned structures. Turning to FIG. 3a, ideally, after etching, vertical interconnect 42 sits directly on and in contact with etch stop layer 38 (in this example shown formed on top of body polysilicon line 24), with no misalignment. In reality, some misalignment is bound to occur, as in FIG. 3b, and can be tolerated. During the etch that forms vertical interconnect 42, the etch will stop on etch stop wire 38 on the portion of interconnect 42 that overlies etch stop wire 38. Where the mask, and thus the pattern and etch, is misaligned with etch stop wire 38, the etch will continue and stop on underlying dielectric layer 22 for the first level or dielectric layer 44, or its equivalent, for the second or higher levels. The etch stop material of etch stop wire 38 can be considered to stop the etch if it stops any portion of the etch. When this description speaks of an etch stop "layer," that layer need not be a continuous blanket. The layer may be in the form of a wire, an underlying contact, or some other shape.

Figure 4:
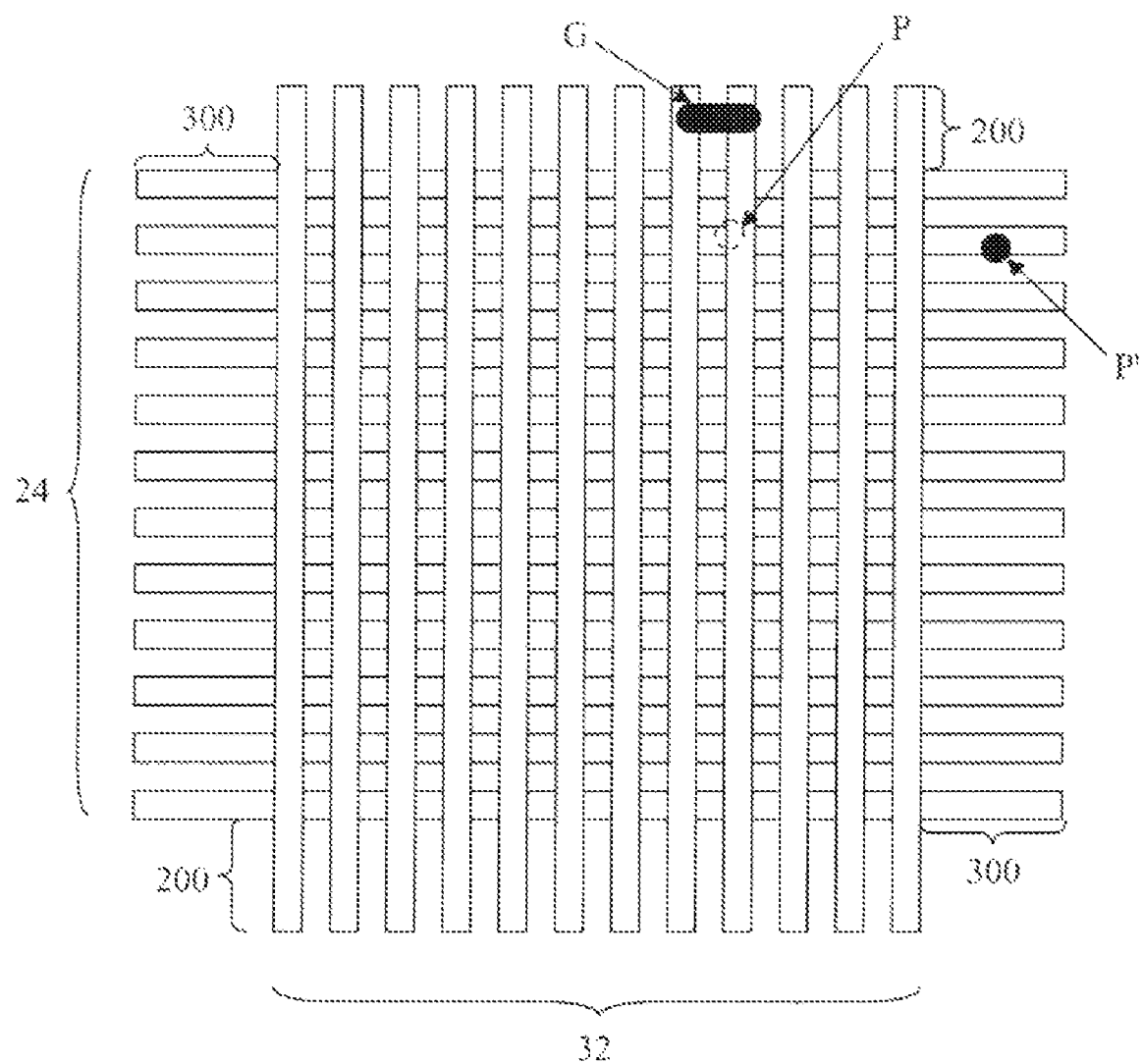
FIG. 4 is a top view of a possible layout for an array in which a preferred embodiment of the present invention can be used.

As noted, patterned vertical interconnects can be formed on top of and electrically coupled to gate polysilicon lines 32. In the detailed example given using vertical interconnects used in a monolithic three dimensional memory, a preferred layout for body polysilicon lines 24 and gate polysilicon lines 32 in one memory level is shown in FIG. 4. The effects of misalignment need to be considered when placing vertical interconnects. Consider, for example, a vertical interconnect intended to provide an electrical connection to one of gate polysilicon lines 32 only. Such an interconnect can be formed on top of a gate polysilicon line 32 at point P, which is located on one of gate polysilicon lines 32 within the array where it crosses over one of body polysilicon lines 24. If some misalignment occurs, though, the vertical interconnect will make electrical contact not only with the gate polysilicon line 32, as intended, but may also make an unintended contact with one of the underlying body polysilicon lines 24 (which, it will be recalled, have etch stop layer 38 formed on top of them.) Thus it is preferred to form vertical interconnects on top of and electrically coupled with gate polysilicon lines 32 in fan-out area 200, for example at point P' where there are no underlying body polysilicon lines. Similarly, vertical interconnects to body polysilicon lines 24 may advantageously be formed in fan-out area 300.

Interconnects made according to the methods described herein can, of course, be placed wherever electrical connections are required. If, for example, an electrical connection between one of gate polysilicon lines 32 and body polysilicon lines 24 is in fact intended, placement at point P may be advantageous; the interconnect itself could be formed to be larger than the width of polysilicon line 32 to ensure a connection to underlying polysilicon body line 24, even with perfect alignment of the interconnect atop gate polysilicon line 32. Further, the conductive materials connected need not be vertically separate; a patterned interconnect formed by an etch stopping on an etch stop layer as described herein can be formed, for example, to connect two or more gate polysilicon lines 32, as shown by gate interconnect G in FIG. 4. Many other examples can be imagined.

As noted earlier, it may be possible to form vertical interconnects having a smallest patterned dimension substantially the same as the minimum feature size when minimum feature size is not too small, but this becomes more difficult at very small minimum feature size. A vertical interconnect formed as described herein, however, can have a smallest patterned dimension substantially the same as the minimum feature size at very small feature size, for example for a minimum feature size smaller than about 0.25 micron, and more specifically for a minimum feature size of about 0.065 micron.

Figure 3B:
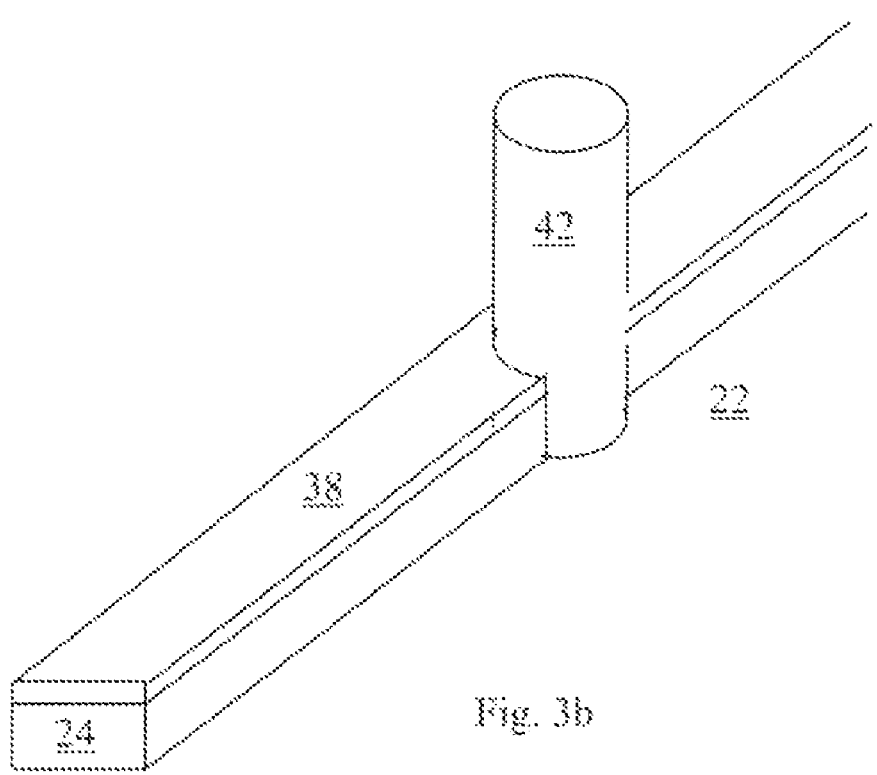

In FIGS. 3a and 3b, vertical interconnect 42 is shown to have a substantially cylindrical shape. Rectangular features formed with feature size in both dimensions less than about 0.25 microns using standard photomasking techniques tend to be substantially cylindrical, regardless of the shape of the mask. As feature size decreases in semiconductor processing, current photolithography techniques tend to round any sharp corners on features.

The methods and vertical interconnects disclosed herein can be used to advantage in other monolithic three dimensional memories, such as those described in Johnson et al., U.S. Pat. No. 6,034,882, "Vertically-Stacked, Field Programmable, Nonvolatile-Memory and Method of Fabrication"; Johnson, U.S. Pat. No. 6,525,953, "Vertically-Stacked, Field Programmable, Nonvolatile-Memory and Method of Fabrication"; Knall et al., U.S. Pat. No. 6,420,215, "Three Dimensional Memory Array and Method of Fabrication"; Lee et al., U.S. patent application Ser. No. 09/927,648, "Dense Arrays and Charge Storage Devices, and Methods for Making Same," filed Aug. 13, 2001; Herner et al., U.S. patent application Ser. No. 10/326,470, "An Improved Method for Making High Density Nonvolatile Memory," filed Dec. 19, 2002; Walker et al., U.S. application Ser. No. 10/335,089, "Method for Fabricating Programmable Memory Array Structures Incorporating Series-Connected Transistor Strings," filed Dec. 31, 2002; Scheuerlein et al., U.S. application Ser. No. 10/335,078, "Programmable Memory array Structure Incorporating Series-Connected Transistor Strings and Methods for Fabrication and Operation of Same," filed Dec. 31, 2002; Cleeves, U.S. patent application Ser. No. 10/185,508, "Three Dimensional Memory," filed Jun. 27, 2002; and Johnson, U.S. patent application Ser. No. 10/185,208, "Low-cost, serially-connected, Multi-level Mask-Programmable Read-only Memory," filed Jun. 27, 2002, all assigned to the assignee of the present application and hereby incorporated by reference.

Most of the patents and patent applications incorporated by reference describe or include a memory array which comprises a plurality of first array lines extending in a first direction and a plurality of second array lines extending in a second direction substantially perpendicular to the first direction. Vertical interconnects formed as provided herein, which are etched as positive features with an etch stopping on an etch stop layer, rather than as high-aspect ratio voids which are then filled, could advantageously be formed in a fan-out area of these arrays, or elsewhere.

It will be understood that the ability to make vertical interconnects at the minimum feature size would benefit conventional two-dimensional memories as well. The actual type of the memory cell is irrelevant, and vertical interconnects according to the disclosure herein could be used in any sort of volatile or nonvolatile memory. The cells might be, for example, SONOS, floating gate, diodes, or incipient diodes, wherein diode portions are separated by an antifuse and become a diode when the antifuse is ruptured.

Further, vertical interconnects are used to connect devices included in any plurality of active elements, including memory, logic, or other devices, to each other or to metallization. Examples of such devices include, but are not limited to, logic devices, transistors formed in monocrystalline silicon, thin-film transistors, capacitors, resistors, inductors, diodes, interconnects, PROMs, EPROMSs, and EEPROMs.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A plurality of active elements comprising: active elements having a minimum lithographic feature size of about 0.065 micron; and at least one vertical interconnect having a smallest patterned dimension substantially the same as the minimum feature size.

2. A plurality of active elements comprising:
   active elements having a minimum lithographic feature size less than 0.25 micron; and
   at least one vertical interconnect comprising:
      an etch stop layer over and interfacing with a first conductor;
      a vertical contact over and interfacing with the etch stop layer; and
      a metal silicide over and interfacing with the vertical contact, where at least one vertical interconnect has a smallest patterned dimension substantially the same as the minimum feature size.

3. The plurality of active elements of claim 2:
   the etch stop layer comprising at least one of:
      titanium silicide; and
      nickel silicide.

4. A method of forming a plurality of active elements comprising: forming active elements having a minimum lithographic feature size of about 0.065 micron; and forming at least one vertical interconnect having a smallest patterned dimension substantially the same as the minimum feature size.

5. A method of forming a plurality of active elements comprising:
   forming active elements having a minimum lithographic feature size less than 0.25 micron; and
   forming at least one vertical interconnect comprising:
      forming an etch stop layer over and interfacing with a first conductor;
      forming a layer of contact material over and interfacing with the etch stop layer;
      etching the contact material to form a vertical contact, the etching stopping on the etch stop layer; and
      forming a metal silicide over and interfacing with the vertical contact, where at least one vertical interconnect has a smallest patterned dimension substantially the same as the minimum feature size.

6. The method of claim 5, forming the etch stop layer comprising forming titanium silicide.

7. The method of claim 6, forming the etch stop layer comprising forming titanium over and interfacing with the first conductor; and
   annealing the titanium to form the titanium silicide.

8. The method of claim 5, forming the etch stop layer comprising forming nickel silicide.

9. The method of claim 8, forming the etch stop layer comprising forming nickel over and interfacing with the first conductor; and annealing the nickel to form the nickel silicide.

10. The method of claim 8 comprising forming a second conductor over and interfacing with the nickel silicide such that the first conductor is electrically coupled with the second conductor.

11. The method of claim 6 comprising forming a second conductor over and interfacing with the titanium silicide such that the first conductor is electrically coupled with the second conductor.

12. The method of claim 5 comprising forming the vertical interconnect to have a minimum lithographic feature size less than 0.18 micron.

13. The method of claim 5, forming a metal silicide over and interfacing with the vertical contact comprising forming at least one of titanium silicide and nickel silicide.

14. The method of claim 6, forming a metal silicide over and interfacing with the vertical contact comprising forming at least one of titanium silicide and nickel silicide.

15. The method of claim 8, forming a metal silicide over and interfacing with the vertical contact comprising forming at least one of titanium silicide and nickel silicide.

16. A monolithic three dimensional memory array comprising:
   first and second memory levels;
   a plurality of active elements having a minimum lithographic feature size less than 0.25 micron; and
   at least one first vertical interconnect comprising:
      a first etch stop layer over and interfacing with a first conductor;
      a first vertical contact over and interfacing with the first etch stop layer; and
      a first metal silicide over and interfacing with the first vertical contact, where at least one vertical interconnect has a smallest patterned dimension substantially the same as the minimum feature size.

17. The monolithic three dimensional memory array of claim 16 comprising at least one second vertical interconnect over and interfacing with the first vertical interconnect comprising:
- a second vertical contact over and interfacing with the first metal silicide; and
- a second metal silicide over and interfacing with the second vertical contact.

18. The monolithic three dimensional memory array of claim 17, the first etch stop layer comprising at least one of titanium silicide and nickel silicide.

19. The monolithic three dimensional memory array of claim 17, at least one of the first metal silicide and second metal silicide comprising at least one of titanium silicide and nickel silicide.

20. The monolithic three dimensional memory array of claim 18, at least one of the first metal silicide and second metal silicide comprising at least one of titanium silicide and nickel silicide.

21. The monolithic three dimensional memory array of claim 16, the first vertical interconnect having a minimum lithographic feature size less than 0.18 micron.

22. A memory array comprising:
- a plurality of first array lines extending in a first direction;
- a plurality of second array lines extending in a second direction substantially perpendicular to the first direction; and
- at least one vertical interconnect comprising:
  - an etch stop layer over and interfacing with a first conductor;
  - a vertical contact over and interfacing with the etch stop layer; and
  - a metal silicide over and interfacing with the vertical contact.

23. The memory array of claim 22, at least one of the etch stop layer and the metal silicide comprising at least one of titanium silicide and nickel silicide.

24. A memory array comprising: a plurality of first array lines extending in a first direction; a plurality of second array lines extending in a second direction substantially perpendicular to the first direction; a plurality of active elements having a minimum lithographic feature size of about 0.065 micron; and at least one vertical interconnect having a smallest patterned dimension substantially the same as the minimum feature size.

25. The memory array of claim 24 the at least one vertical interconnect comprising:
- a titanium silicide or nickel silicide etch stop layer over and interfacing with a first conductor;
- a vertical contact over and interfacing with the etch stop layer; and
- a titanium silicide or nickel silicide over and interfacing with the vertical contact.

* * * * *